US007491946B2

(12) United States Patent
Risse et al.

(10) Patent No.: US 7,491,946 B2
(45) Date of Patent: Feb. 17, 2009

(54) ELECTROSTATIC DEFLECTION SYSTEM FOR CORPUSCULAR RADIATION

(75) Inventors: Stefan Risse, Jena (DE); Thomas Peschel, Jena (DE); Christoph Damm, Jena (DE); Andreas Gebhardt, Apolda (DE); Mathias Rohde, Jena (DE); Christoph Schenk, Jena (DE); Thomas Elster, Jena (DE); Hans-Joachim Doering, Jena (DE); Gerhard Schubert, Jena (DE)

(73) Assignee: Leica Microsystems Lithography GmbH, Jena (DE)

( * ) Notice: Subject to any disclaimer, the term of this patent is extended or adjusted under 35 U.S.C. 154(b) by 357 days.

(21) Appl. No.: 11/346,666

(22) Filed: Feb. 3, 2006

(65) Prior Publication Data

US 2006/0192133 A1 Aug. 31, 2006

(30) Foreign Application Priority Data

Feb. 4, 2005 (DE) ....................... 10 2005 005 801

(51) Int. Cl.
*H01J 37/147* (2006.01)

(52) U.S. Cl. .................................................. 250/396 R

(58) Field of Classification Search ............. 250/396 R, 250/492.2

See application file for complete search history.

(56) References Cited

U.S. PATENT DOCUMENTS

| | | | | |
|---|---|---|---|---|
| 3,497,744 | A | 2/1970 | Himmelbauer et al. | |
| 5,245,194 | A * | 9/1993 | Oae et al. | 250/492.2 |
| 5,929,452 | A | 7/1999 | Yoshitake et al. | |
| 6,055,719 | A * | 5/2000 | Ooaeh et al. | 29/592.1 |

FOREIGN PATENT DOCUMENTS

| | | |
|---|---|---|
| DE | 31 38 898 | 4/1983 |
| DE | 199 30 234 | 12/1999 |
| EP | 0 999 572 | 5/2000 |
| EP | 1 033 738 | 9/2000 |
| JP | 57-206172 | 12/1982 |
| JP | 59-180943 | 10/1984 |
| JP | 2-247966 | 10/1990 |
| JP | 5-129193 | 5/1993 |

* cited by examiner

*Primary Examiner*—Kiet T Nguyen
(74) *Attorney, Agent, or Firm*—Reed Smith LLP

(57) ABSTRACT

The invention is directed to electrostatic deflection systems for corpuscular beams which can be used particularly in microstructured and nanostructured applications in lithography installations or measuring equipment. According to the proposed object of the invention, the individual electrodes of a deflection system of this kind should permanently have and retain a very exact axially symmetric arrangement relative to one another. In the electrostatic deflection system according to the invention, rod-shaped electrodes are held in an axially symmetric arrangement in an inwardly hollow carrier through which a corpuscular beam can be directed. The carrier is formed of at least two, and at most four, carrier members which are connected to one another.

21 Claims, 2 Drawing Sheets

ELECTROSTATIC DEFLECTION SYSTEM FOR CORPUSCULAR RADIATION

CROSS-REFERENCE TO RELATED APPLICATION

This application claims priority of German Application No. 10 2005 005 801.9, filed Feb. 4, 2005, the complete disclosure of which is hereby incorporated by reference.

BACKGROUND OF THE INVENTION a) Field of the Invention

The invention is directed to electrostatic deflection systems for corpuscular radiation which can be used particularly for microstructured and nanostructured applications in lithography installations or measuring equipment (e.g., REM).

b) Description of the Related Art

For processes such as those mentioned above, it is desirable to have the capability for high-precision deflection of charged corpuscles, particularly electrons with a small time constant. Further, a deflection system of this type should have only a small space requirement so that it can be installed in favorable positions in the electron-optical installation.

DE 199 30 234 A1 discloses an electrostatic deflection device in which the rod-shaped electrode elements are arranged inside a holding device The individual electrode elements are produced from a conductive ceramic material with a predetermined specific resistance. The holding device is constructed as a hollow cylindrical tube. The individual electrode elements are then inserted into the holding device in a desired axially symmetric arrangement and are connected to the holding device by material bonding.

In this connection, it has turned out that the adjustment accuracy required for a high-precision deflection of a corpuscular beam when the individual electrode elements are arranged relative to one another so as to maintain exact axial symmetry cannot be met during assembly on the one hand and, on the other hand, connection by material bonding leads to deviations in the positioning of the individual electrode elements at the holding device. The material-bonding connection is produced by spot-soldered or glued connections through openings formed in the holder.

Deflection systems should also be suitable for use in rapidly changing magnetic fields, which is advantageous for low-aberration electron-optical solutions.

Deflection devices for electron beams which are not easily reproducible can also be produced in this form.

Further, deflection systems in which the individual electrodes are formed of tensioned wires are also known as is described, for example, in EP 1 033 738 A1. The wires, to which tensile force is applied, form weak points particularly in that they are exposed to high mechanical loads at their material-bonded connection points which can result in detachment or in different pretensioning.

Further, the wires forming individual electrodes can have deviations in electrical parameters which lead to inhomogeneity in the electrical fields that can be used for the deflection of electron beams.

OBJECT AND SUMMARY OF THE INVENTION

Therefore, it is the primary object of the invention to provide an electrostatic deflection system for corpuscular radiation in which the individual electrodes permanently have and retain a very exact axially symmetric arrangement relative to one another.

According to the invention, this object is met by an electrostatic deflection system for corpuscular radiation comprising an axially symmetric arrangement in which electrodes are held in an inwardly hollow carrier through which an electron beam is directed. The carrier is formed of at least two, and at most four, carrier members which are connected to one another.

The electrostatic deflection system according to the invention likewise uses a plurality of rod-shaped electrodes, as is known from the prior art, which are held in an axially symmetric arrangement in an inwardly hollow carrier. The respective corpuscular radiation to be deflected can then be directed through this hollow carrier so that its deflection can be influenced for lithographic applications by the electrical fields which are formed around the rod-shaped electrodes and which can be influenced in a corresponding manner. The carrier according to the invention is formed of at least two, and at most four, carrier members which are connected to one another. The carrier is preferably formed by two carrier members.

The individual carrier members can be fitted with the rod-shaped electrodes prior to the actual assembly of the carrier members to form an individual carrier. In this way, there is very good access to the interior of the carrier when inserting the rod-shaped electrodes in an advantageous arrangement so that it is possible to exactly position and adjust the rod-shaped electrodes and to fix the electrodes to the carrier members beforehand. This also facilitates access for optical or tactile measurement methods.

The carrier members forming the carrier can preferably be mechanically machined beforehand so that they can be precisely positioned, adjusted and subsequently connected to one another, preferably by material bonding, when assembling a carrier. During assembly, the arrangement of the individual electrodes is retained and the axial symmetry is produced for the entire system.

It is advantageous for the positioning and adjustment of the rod-shaped electrodes to provide support areas for the electrodes at the carrier members. The individual electrodes can then be fixed to the respective support areas by material bonding. This can preferably be carried out by means of solder connections but also by glue connections.

The individual electrodes should have already been supported and fixed at two support areas at a distance from one another.

In a particularly advantageous manner, the support areas are formed at the ends directly on the carrier members. The support areas can be formed at annular flanges formed in the interior of a carrier formed of carrier members. One support area should be formed at the end face of the carrier member and another support area should be formed at the opposite end face of the carrier member.

The support areas can preferably be constructed in a stair-shaped manner which can be carried out in a highly precise manner by mechanical machining at the respective carrier members.

For an exact positioning of the electrodes, these electrodes can be arranged in a kinematically defined manner so as to rest on a step in each instance and can subsequently be fixed by material bonding as was already mentioned. In this way, a defined axially symmetric arrangement of the individual electrodes of an electrostatic deflection system can be achieved and also permanently maintained. The corners of individual steps of the stair structure of support areas can be constructed as 90-degree V-grooves.

Also, a certain curvature of the individual electrodes cannot be avoided for reasons relating to manufacturing technique, particularly in that the rod-shaped electrodes which can be used in a deflection system according to the invention have a high aspect ratio, i.e., a large length compared to the outer diameter or cross-sectional dimensions. However, when using a deflection system according to the invention, a curvature of this kind can negatively impact the defined forming of electrical fields for the deflection of a corpuscular beam.

For this reason, the respective curvature of the individual electrodes should be taken into consideration when assembling and fixing to the carrier members. For example, the arrangement and orientation of the individual electrodes that are fastened to the carrier members can be advantageously selected in such a way that their respective convex curvature is directed radially outward in relation to the longitudinal axis of the deflection system. In this way, a positive influence can again be exerted on the desired axially symmetric arrangement of the electrodes at the carrier.

Further, the individual electrodes can be measured prior to assembly to determine the respective curvature of an electrode.

In this way, electrodes having identical curvatures, but at least curvatures lying within a close tolerance range, can be used for a deflection system in a particularly advantageous manner.

Optical measuring methods, known per se, can be used to determine the curvature. In order to ensure that the orientation of the convex curvature of electrodes is also detected and can be kept within a tolerance range of plus or minus 5° in radial direction during the mounting of the electrodes in the carrier members, the respective rod-shaped electrodes can be ground at an oblique angle at least at one end face. This obliquely inclined end face can then be used to determine the orientation of the convex curvature. After this is determined, this end face, or the opposite end face, can be provided with a corresponding mark that can convey information about the orientation of the curvature of the respective rod-shaped electrode.

Accordingly, a kind of barrel-shaped or waisted cage can be formed by means of the electrodes which are arranged and correspondingly fixed in the carrier and oriented in a corresponding manner.

In a particularly advantageous embodiment form, at least one additional support area can be provided and formed at the carrier members and consequently also after assembly at the carrier. A support area of this kind can preferably be arranged centrally between the support areas arranged at the ends so that the outwardly curved rod-shaped electrodes can contact this support area arranged between the two outer support areas and the curvature of the rod-shaped electrodes is reduced as far as possible.

This third support area and also, if necessary, another support area can have a stepped structure, as was already mentioned, and the positioning and fixing of the rod-shaped electrodes can likewise be carried out analogously in the corresponding grooves of a respective step.

The carrier members which are to be assembled to form a carrier should be produced from a dielectric material having high strength and dimensional stability. Further, it should be mechanically machinable as far as possible for the desired highly precise microstructuring. For example, glass ceramics are suitable materials for the carrier members. In this way, for instance, as opposed to the use of metals, eddy currents can be prevented.

In order to prevent electrostatic charges, these carrier members should be provided with an electrically conductive coating which can then be connected to ground when using a deflection system according to the invention.

In the following, the invention will be described more fully by way of example.

DESCRIPTION OF THE PREFERRED EMBODIMENTS

Figure 1:
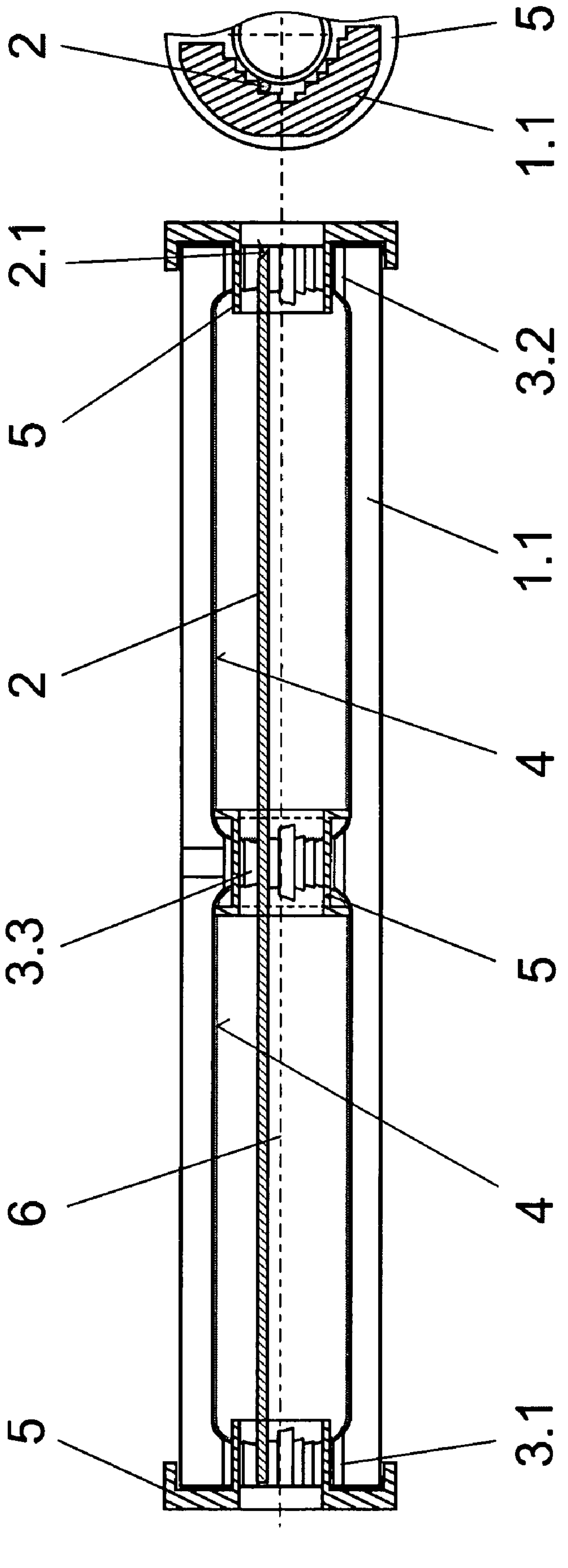
FIG. 1 is a top view of a carrier member showing an example of a deflection system according to the invention.

FIG. 1 shows a top view of a carrier member 1.1 which can be assembled with another carrier member 1.2 (not shown) to form a common carrier 1 and can then be connected to one another, preferably in a material engagement, e.g., by laser soldering.

The support areas 3.1, 3.2 and 3.3 are formed at the two outer end faces and centrally therebetween.

The carrier member 1.1, as well as the carrier member 1.2 not shown, can be produced from a glass ceramic by mechanical micromachining. In particular, the stair structure of the support areas 3.1, 3.2 and 3.3 can be mechanically formed in this way so as to have the desired high precision.

The carrier member 1.1 is coated with a layer system described as follows.

In order to prevent electrostatic charges, the carrier members 1.1 and 1.2 should be provided with an electrically conductive coating 4 which can then be connected to ground when using a deflection system. For this purpose, the outer surfaces of the carrier members 1.1 and 1.2 can be provided with a metal coating or other electrically conductive coating 4.

An individual layer or a layer system 4.1 and 4.2 comprising metal or metal alloys can be formed for this purpose. For example, it is possible to provide the surface of carrier members 1.1 and 1.2 with a base layer 4.1 of nickel that is provided with an overlayer 4.2 of gold as a layer system. A nickel coat and subsequently a gold coat can be provided by an electroless process. The gold overlayer 4.2 provides for improved wetting for a material-bonding connection by soldering.

However, other coating methods and layers or layer systems by which coats with very good conductivity and good wetting behavior can be generated and can also be used. This also protects against environmental influences and affords the possibility of cleaning by means of plasma. Instead of gold, other metals which likewise possess this property can also be used.

The coating 4 between the individual surface regions at the support areas 3.1, 3.2 and 3.3 is then removed subsequently in order to achieve electrical isolation between the individual areas.

The regions of the support areas 3.1, 3.2 and 3.3 of the carrier members 1.1 and 1.2 which come into contact or are capable of coming into contact with the rod-shaped electrodes 2 may not be electrically conductive in relation to one another; therefore, each individual electrode 2 is held so as to be electrically insulated from its neighbor.

These surfaces of the support areas 3.1, 3.2 and 3.3 can either not be coated or the coating can be removed again subsequently. This can be carried out, for example, by means of a mechanical removal by microcutters or chemically by localized etching.

Figure 2:
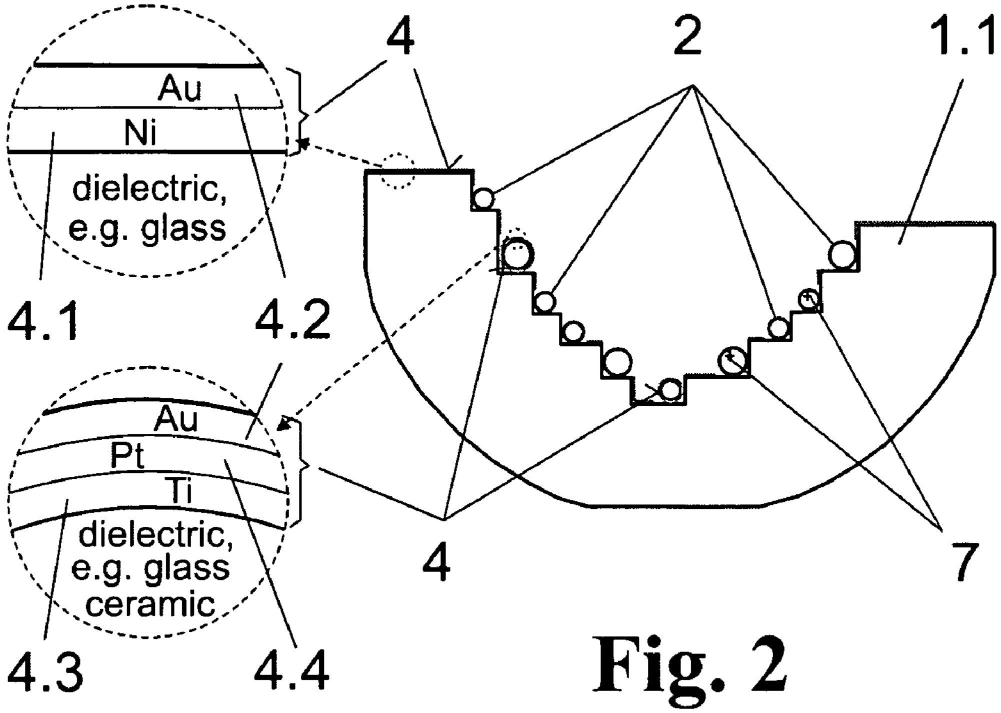
FIG. 2 is a side view of a carrier member with electrodes.

As shown in FIG. 2, the rod-shaped electrodes 2 can be produced from dielectric materials which are coated in an electrically conductive manner at their outer surfaces subsequently. This is advantageous when used in rapidly changing magnetic fields.

For example, the rod-shaped electrodes 2 can be produced from a glass, preferably by a drawing process. Borosilicate glass, preferably silica glass, can be used for production.

When producing rod-shaped electrodes 2 of the kind described above, care must be taken to provide as far as possible for uniform roundness and cylindricity, to maintain a constant diameter and prevent bending and twisting.

After manufacture, selection and sorting can be carried out according to certain guidelines by means of suitable measuring methods. The outer diameter and the respective bow/curvature can be appropriate selection parameters so that the rod-shaped electrodes 2 used in a deflection system are at least almost identical.

A bow/curvature should be less than 5 μm over the entire length of an electrode 2 assuming an electrode length of 200 millimeters for example. Deviations from roundness and cylindricity should be less than 1 μm. Variations in diameter should likewise be less than 1 μm.

In order to ensure that the orientation of a convex curvature of electrodes 2 is also detected and can be kept within a tolerance range of plus or minus 5° in radial direction during the mounting of the electrodes 2 in the carrier members, the respective rod-shaped electrodes 2 can be ground at an oblique angle 2.1 at least at one end face. This obliquely inclined end face can then be used to determine the orientation of the convex curvature. After this is determined, this end face, or the opposite end face, can be provided with a corresponding mark 7 that can convey information about the orientation of the curvature of the respective rod-shaped electrode 2.

The rod-shaped electrodes 2 produced from the dielectric material can then be provided subsequently with an electrically conductive coating 4 having good electrical conductivity, high adhesive strength, and suitability for use under vacuum. Further, they should be solderable and free from hydrocarbons. It has turned out that these characteristics can be achieved in a particularly advantageous manner by a layer system comprising a plurality of layers of different metals. A layer system of this type can be formed by a multi-step sputtering process. However, individual coats can also be used.

An adhesion-imparting coat of titanium can be formed directly on the outer surface of the electrodes 2 produced from dielectric material. A diffusion barrier layer of platinum can then be applied to this titanium coat and a solderable gold layer can then be applied to this platinum layer. A layer system of this kind can have a total thickness of about 300 nm.

If possible, at least eight electrodes 2 should be used in a deflection system according to the invention. However, for many applications, a larger quantity of electrodes 2 is preferable. For example, twelve or twenty such electrodes 2 can be used in a deflection system without difficulty. However, for simple applications four electrodes 2 may also be sufficient.

It is also advantageous to arrange electrodes 2 with different diameters in relation to the longitudinal axis 6. The electrodes 2 can be arranged in a deflection system on at least two, preferably at least three, different diameters in relation to the longitudinal axis 6 of the deflection system. In an arrangement of this kind, the axial symmetry should also be taken into account. Accordingly, an electrical field that is as homogeneous as possible is formed in the interior of the system and achieves particularly good suppression of higher-order interference, e.g., third-order and fifth-order fields. This can also be achieved by other arrangements of electrodes 2 with identical or different diameters.

As was already mentioned, there are regions at the support areas 3.1, 3.2 and 3.3 which do not have electrically conductive coating. For this reason, shielding flanges 5 are advantageously arranged in the region of the support areas 3.1, 3.2 and 3.3.

For example, two shielding flanges 5 can form outer terminations at the ends of the carrier members 1.1 and 1.2. They can be connected by material bonding to the carrier members 1.1 and 1.2 that have already been assembled to form a carrier 1. However, these end terminations should be formed in such a way that there are openings through which a corpuscular beam can be directed by the deflection system.

When a third support area 3.3 is provided at a carrier 1 for the deflection system, a shielding flange 5 should also be provided there. This can be produced as an annular structure, and the outer contour at the step contour of the support area 3.3 can be constructed with corresponding recesses for the electrodes 2 while taking into account the arrangement of the electrodes 2. Another aspect of this latter feature is that the electrodes 2 are also not exposed to forces leading to deformation and twisting.

The electrodes 2 can be connected to the carrier members 1.1 and 1.2 in particular at the support areas 3.1 and 3.2 arranged at the end of the carrier members 1.1 and 1.2. This can be carried out by means of a laser soldering process with suitable solders and, if necessary, with the addition of flux.

The material-bonding connection of the electrodes 2 to the carrier members 1.1 and 1.2 can also be carried out by gluing. UV-curable adhesives which are suitable for use under vacuum conditions should preferably be used for this purpose.

The electrodes 2 which are mounted and fixed at the carrier members 1.1 and 1.2 are contacted in an electrically conductive manner at one end. This can be carried out, for example, by soldering on thin gold wires having a diameter of about 100 μm. These gold wires can then be connected again in an electrically conducting manner to corresponding contact surfaces of a contact board so that each individual electrode 2 can be acted upon by a suitable voltage for specific deflection of a corpuscular beam. However, certain electrodes 2 can also form groups, each of which is acted upon by the same voltage or is connected to ground.

A contact board of this kind that is provided with contact surfaces can be arranged at an end face of the deflection system. This can be carried out at a shielding flange or a contact board can also be an integral component of a shielding flange 5 of this kind.

The construction of the stair structures at the support areas 3.1, 3.2 and 3.3 can be seen particularly clearly from the side view of the carrier member 1.1 shown in FIG. 2.

An electrode 2 is inserted into every 90-degree V-groove of a step so as to be positioned in a defined manner and, as was also already explained in the general description, is connected by material bonding.

Further, it is clear from FIG. 2 that electrodes 2 are arranged on different diameters in relation to the longitudinal axis of the carrier 1 and of the deflection system according to the invention, and the electrodes 2 can also have different outer diameters. The electrodes 2 arranged on a common diameter in relation to the longitudinal axis should have the same outer diameter.

Figure 3:
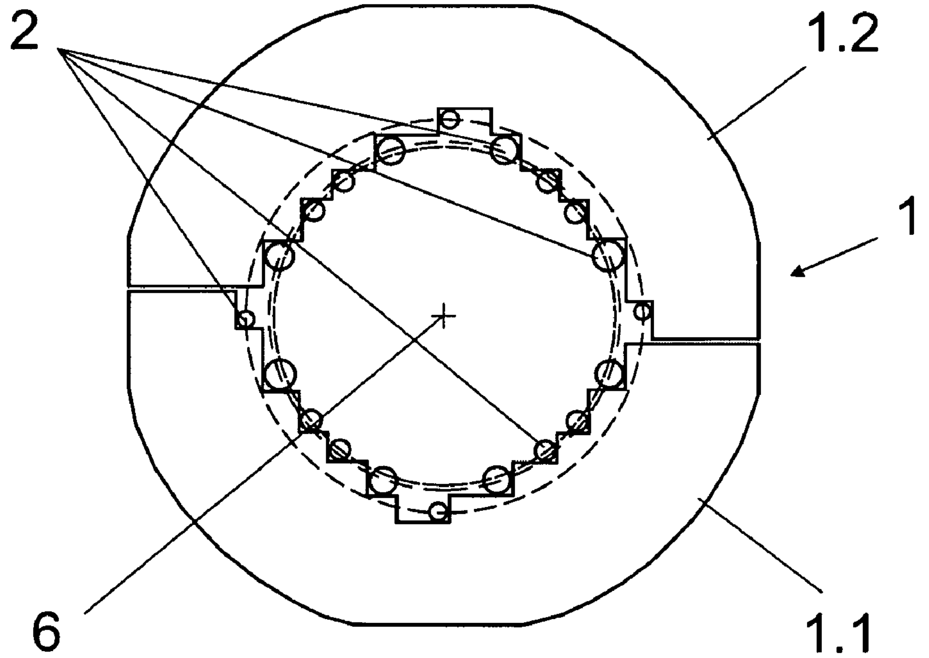
FIG. 3 is a side view showing two carrier members according to FIG. 1 which are connected to one another to form a common carrier.

FIG. 3 shows the carrier members 1.1 and 1.2 which are assembled and joined to form a carrier 1 and which have an electrode 2 fastened thereto in each instance. The arrangement of electrodes 2 on different diameters in relation to the longitudinal axis can also be seen clearly in this figure.

The electrodes 2 were obtained from silica glass by a drawing process and, as was explained in the general description, were provided with a layer system with an adhesion layer of titanium, a diffusion barrier layer of platinum, and a gold layer.

While the foregoing description and drawings represent the present invention, it will be obvious to those skilled in the art that various changes may be made therein without departing from the true spirit and scope of the present invention.

What is claimed is:

1. An electrostatic deflection system for corpuscular beams, comprising:

an axially symmetric arrangement through which an electron beam is directed, said arrangement being formed as an inwardly hollow carrier in which rod-shaped electrodes are held;

said carrier having two ends in direction of a longitudinal symmetry axis of the deflection system and being formed of at least two carrier members which are connected to one another.

2. The deflection system according to claim 1, wherein said carrier members are provided with first and second support areas for the electrodes and the electrodes are fixed to the first and second support areas by material bonding.

3. The deflection system according to claim 2, wherein the first and second support areas are formed at ends of the carrier members.

4. The deflection system according to claim 3, wherein the first and second support areas are constructed in a stair-shaped manner and the electrodes are each arranged to rest in a groove of a step of the stair-shaped support areas in an axially symmetric arrangement.

5. The deflection system according to claim 4, wherein the grooves of the steps form a 90-degree V-groove.

6. The deflection system according to claim 2, wherein at least one additional support area is formed between the first and second support areas arranged at ends of the carrier members.

7. The deflection system according to claim 2, wherein the carrier members and the electrodes are both formed of a dielectric material, and the carrier members are provided with an interior electrically conductive coating, and the electrodes are provided an exterior electrically conductive coating.

8. The deflection system according to claim 2, wherein the electrodes are connected to the carrier members at the support areas by material bonding so as to be electrically insulated.

9. The deflection system according to claim 2, wherein shielding flanges are arranged near the support areas.

10. The deflection system according to claim 1, wherein electrodes that have a curvature are so oriented in the carrier members that a convex curvature is directed radially outward in relation to the longitudinal symmetry axis of the deflection system.

11. The deflection system according to claim 10, wherein the electrodes are ground at an oblique angle on at least one end face.

12. The deflection system according to claim 10, wherein a mark indicating the orientation of the curvature of the electrodes is provided at the electrode.

13. The deflection system according to claim 1, wherein the electrodes are arranged on at least two different diameters in relation to the longitudinal symmetry axis of the deflection system.

14. The deflection system according to claim 1, wherein the electrodes are held in the carrier members at different diameters.

15. The deflection system according to claim 1, wherein two shielding flanges form outer terminations at ends of the carrier members and are connected by material bonding to the carrier members that have been connected to one another.

16. The deflection system according to claim 15, wherein electrical contact for the individual electrodes is integrated in or on one of the shielding flanges or arranged at the shielding flanges.

17. The deflection system according to claim 1, wherein the electrodes are produced from glass by a drawing process.

18. The deflection system according to claim 1, wherein an electrically conductive coating of the electrodes is formed of a layer system comprising a plurality of layers of different metals which are formed one above the other.

19. The deflection system according to claim 18, wherein the layer system is formed of titanium, platinum and gold.

20. The deflection system according to claim 1, wherein the carrier members are formed of glass ceramic and have an interior electrically conductive coating comprising a nickel layer on which a layer of gold is formed.

21. The deflection system according to claim 20, wherein regions on which there is no electrically conductive coating are provided at support areas for the electrodes so that the electrodes can be fastened to the carrier members so as to be electrically insulated.

* * * * *